United States Patent
Kim et al.

(10) Patent No.: US 10,415,134 B2
(45) Date of Patent: Sep. 17, 2019

(54) CRUCIBLE FOR ELECTRON-BEAM EVAPORATOR

(71) Applicant: KOREA INSTITUTE OF ENERGY RESEARCH, Daejeon (KR)

(72) Inventors: Ki-hwan Kim, Daejeon (KR); Jun-Sik Cho, Daejeon (KR); Ara Cho, Daejeon (KR); Jae-Ho Yun, Daejeon (KR); Kyung Hoon Yoon, Daejeon (KR); Jin-su Yoo, Daejeon (KR); Young-Joo Eo, Daejeon (KR); Seoung-Kyu Ahn, Daejeon (KR); Sejin Ahn, Daejeon (KR); Kee Shik Shin, Daejeon (KR); Joo-Hyung Park, Daejeon (KR); Jihye Gwak, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 286 days.

(21) Appl. No.: 15/204,311

(22) Filed: Jul. 7, 2016

(65) Prior Publication Data
US 2017/0044658 A1    Feb. 16, 2017

(30) Foreign Application Priority Data
Aug. 10, 2015  (KR) .................. 10-2015-0112703

(51) Int. Cl.
C23C 16/00   (2006.01)
C23C 14/24   (2006.01)
(Continued)

(52) U.S. Cl.
CPC ............ *C23C 14/243* (2013.01); *C23C 14/14* (2013.01); *C23C 14/30* (2013.01)

(58) Field of Classification Search
CPC .......................... C23C 14/243; C23C 14/30
See application file for complete search history.

(56) References Cited

U.S. PATENT DOCUMENTS 3,702,368 A * 11/1972 Hukin .................. F27B 14/063
                                                        219/634
4,472,453 A *  9/1984 Hoffman ............ H01J 37/3053
                                                        427/566
(Continued)

FOREIGN PATENT DOCUMENTS

JP       2-75888 A      3/1990
JP       6-93429 A      4/1994
(Continued)

OTHER PUBLICATIONS

English translation JP 06-093429, Matsuda, Apr. 1994.*
(Continued)

*Primary Examiner* — Keath T Chen
(74) *Attorney, Agent, or Firm* — Sughrue Mion, PLLC

(57) ABSTRACT

Disclosed is a crucible that exhibits stable evaporation efficiency and durability with respect to Al, is used in an evaporation source of an electron-beam evaporator, and includes a storage unit, which includes a wall and a bottom and in which a deposition material is placed, and a wetting prevention unit that includes another wall, which is taller than the wall of the storage unit, and another bottom, and is combined with an exterior of the storage unit. The wetting prevention unit is provided so that only the wall of the storage unit is wet with Al, and accordingly, the lifespan of the crucible is lengthened. Further, contact with the ceramic material in order to prevent wetting is minimized, thereby preventing a reduction in the physical properties of the thin film due to the impurities mixed with the deposited Al.

8 Claims, 6 Drawing Sheets

(51) Int. Cl.
C23C 14/30 (2006.01)
C23C 14/14 (2006.01)

(56) References Cited

U.S. PATENT DOCUMENTS

| | | | | |
|---|---|---|---|---|
| 4,490,408 A | * | 12/1984 | Zimmerman | C23C 14/046 118/622 |
| 4,700,769 A | * | 10/1987 | Ohara | B22D 27/02 164/138 |
| 2013/0032085 A1 | * | 2/2013 | Hanawa | C30B 25/14 117/103 |
| 2014/0227527 A1 | * | 8/2014 | Brors | H01J 27/04 428/411.1 |

FOREIGN PATENT DOCUMENTS

| | | |
|---|---|---|
| JP | 6-280004 A | 10/1994 |
| JP | 2003-147509 A | 5/2003 |
| KR | 10-0125319 B1 | 12/1997 |
| KR | 1019990025914 A | 4/1999 |

OTHER PUBLICATIONS

Jae-In Jeong, et al. "Evaporation Characteristics of Materials from an Electron-beam Evaporation Source", Journal of the Korean Institute of Surface Engineering, 2011, vol. 44, No. 4.

* cited by examiner

CRUCIBLE FOR ELECTRON-BEAM EVAPORATOR

CROSS-REFERENCE TO RELATED APPLICATION

This application claims the priority benefit of Korean Patent Application No. 10-2015-0112703, filed on Aug. 10, 2015 in the Korean Intellectual Property Office, the disclosure of which is incorporated herein by reference.

BACKGROUND OF THE INVENTION

1. Field of the Invention

The present invention relates to a crucible for use in an electron-beam evaporator, and more particularly to a crucible that increases durability of an electron-beam evaporator to all types of materials.

2. Description of the Related Art

Typical examples of a process for manufacturing a thin film using vacuum deposition include physical vapor deposition (PVD) and chemical vapor deposition (CVD). Physical vapor deposition is classified into an evaporation process, sputtering, and ion plating.

Among the aforementioned processes, a process of manufacturing a thin film that includes evaporating materials using heat is referred to as an evaporation process or vacuum deposition in the narrow sense (vacuum deposition in the broad sense is a common designation including both PVD and CVD). Examples of an evaporation source used in the evaporation process include a resistance-heating evaporation source, an electron-beam evaporation source, and an induction-heating evaporation source.

An electron-beam evaporator includes an electron-beam evaporation source, and materials are contained in a crucible and heated using a high-voltage electron beam to evaporate them. Electron-beam evaporators have been used in various scientific experiments since the 1960s. An electron beam is advantageous in that a highly pure coat film is manufactured, evaporation materials are easily replaced, evaporation is performed at a high speed, it is easy to manufacture a multilayered film, and the manufacturing cost of evaporation materials is low.

However, since Al has a relatively low melting point but a high vaporizing temperature and very high thermal conductivity, Al is one of materials that are difficult to evaporate at a high evaporation rate using an electron beam. In consideration of this characteristic of Al, a crucible including a $TiB_2.BN$ or W material may be used. Thereby, evaporation is stably performed, but the temperature of the evaporation source is increased, wetting the crucible with Al when the power of the electron beam is increased to increase the evaporation rate, and accordingly, Al creeps along the surface of the crucible and overflows it. There are thus drawbacks in that evaporation efficiency is reduced and the crucible must be repeatedly replaced due to the aforementioned wetting phenomenon. "Evaporation Characteristics of Materials from an Electron-beam Evaporation Source" by Jae-In Jeong, et al. (Journal of The Korean Institute of Surface Engineering, Vol. 44, No. 4, 2011) discloses the evaporation characteristics of various materials and problems that occur when Al is evaporated using the known crucible.

In order to prevent the wetting phenomenon, an effort has been made to use a crucible including a ceramic material or a graphite or amorphous carbon material. However, when the crucible including the ceramic material is used, the specific resistance of the deposited Al thin film is relatively increased, and when the crucible including the graphite or amorphous carbon material is used, Al reacts with carbon at a predetermined electric power, thereby breaking the crucible.

The aforementioned characteristics serve as a problem when the Al thin film is deposited using the electron-beam evaporator on a laboratory scale, and also as a major obstacle to the industrial use of the electron-beam evaporator.

SUMMARY OF THE INVENTION

Accordingly, the present invention has been made keeping in mind the above problems occurring in the related art, and an object of the present invention is to provide a crucible exhibiting stable evaporation efficiency and durability with respect to Al, and an electron-beam evaporator including the same.

In order to accomplish the above object, the present invention provides a crucible for an electron-beam evaporator, which is used in an evaporation source of the electron-beam evaporator. The crucible includes a storage unit which includes a wall and a bottom and in which a deposition material is placed, and a wetting prevention unit, which includes another wall, which is taller than the wall of the storage unit, and another bottom, and is combined with an exterior of the storage unit.

The storage unit may include a material that induces the wetting phenomenon of Al, and the wetting prevention unit may include a material that does not induce the wetting phenomenon of Al. Meanwhile, when electron-beam evaporation is performed using a material other than Al, which facilitates the wetting phenomenon, the crucible may be modified so as to include the storage unit, which induces the wetting phenomenon of such material, and the wetting prevention unit, which does not induce the wetting phenomenon of such material.

Specifically, examples of the material that induces the wetting phenomenon of Al may include W, Mo, Ta, $TiB_2$, BN and $TiB_2.BN$. A ceramic material, such as $Al_2O_3$ (alumina), may be used as the material which does not induce the wetting phenomenon of Al.

Further, a wetting prevention unit may include two combined parts including an internal unit and an external unit, the internal unit may include a ceramic material, and the external unit may include a conductive metal material. The external unit may include a Cu material and may be electrically connected to a storage unit. Therefore, the crucible may further include a bolt that includes a conductive material and screws through a through hole, which is formed through the bottoms of the storage unit and the internal unit, to fasten the external unit and the storage unit together, and the bolt may include a material having a high melting point, such as Mo or W.

When the internal side of another wall of the wetting prevention unit is partially exposed due to the difference in height between the wall of the storage unit and another wall of the wetting prevention unit, so that an exposed portion has a height of 2 mm or more, the phenomenon of wetting of the wall may be prevented.

In order to accomplish the above object, the present invention also provides an electron-beam evaporator for radiating accelerated electrons to evaporate a material and then deposit the material, which includes the aforementioned crucible as an evaporation source containing the material.

All types of technologies regarding the electron-beam evaporator may be applied to constitutional parts other than the crucible of the electron-beam evaporator, if they do not conflict with the feature of the present invention, and accordingly, a detailed description thereof will be omitted.

According to the present invention, the wetting prevention unit, which has the relatively tall wall, is provided to wet only the wall of the storage unit, which is positioned on the innermost side, with Al, and accordingly, the lifespan of the crucible is lengthened.

Further, contact with the ceramic material in order to prevent wetting is minimized, thereby preventing deterioration in the physical properties of the thin film due to impurities mixed with deposited Al.

Therefore, it is possible to provide an electron-beam evaporator repeatedly manufacturing a high-quality Al thin film, without replacement of the crucible.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of embodiments of the present invention, with reference to the appended drawings.

Figure 1:
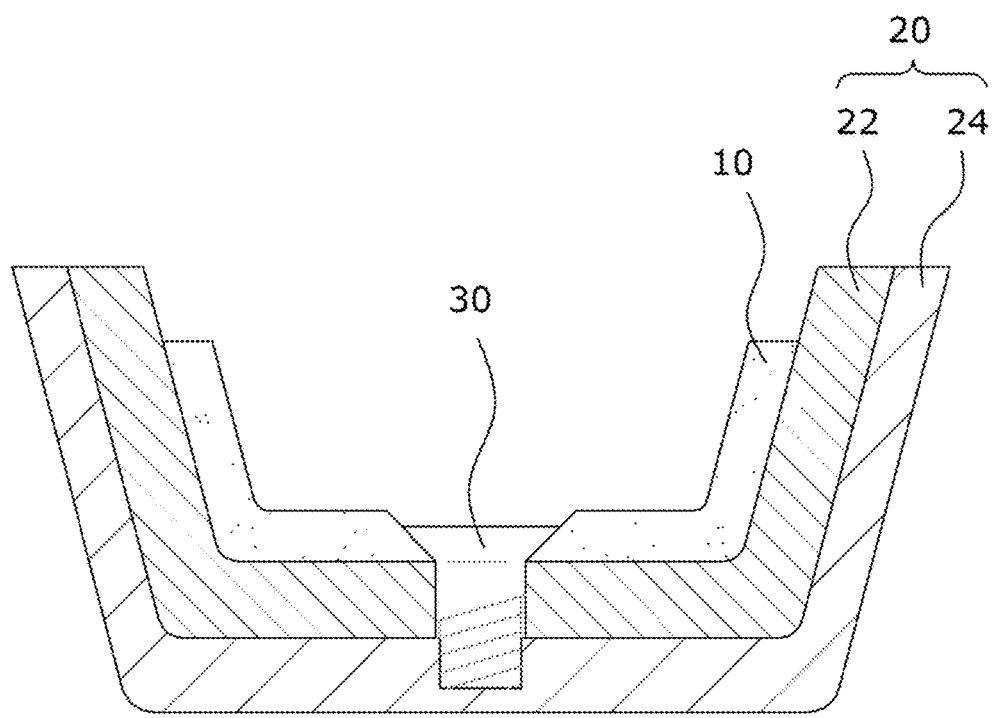
FIG. 1 is a sectional view showing the structure of a crucible for an electron-beam evaporator according to an Example of the present invention.

FIG. 1 is a sectional view showing the structure of a crucible for an electron-beam evaporator according to an Example of the present invention.

Constitutional parts constituting the crucible typically include a bottom and a wall. The wall is tilted at an angle of 15° from a line perpendicular to the bottom, whereby the diameter of the crucible increases with increasing distance from the bottom to thus enable smooth evaporation, without being limited thereto.

In the crucible for the electron-beam evaporator according to the present Example, a storage unit 10, in which a material to be evaporated is placed, constitutes the innermost side of the crucible, and a wetting prevention unit 20 is combined with the exterior of the storage unit 10 to surround the storage unit 10.

The wetting prevention unit 20 includes an internal unit 22 and an external unit 24, which are formed of different materials. A bolt 30 screws through a through hole, which is formed through the bottoms of the storage unit 10 and the internal unit 22, and also into a groove which is formed in the bottom of the external unit 24.

The material to be evaporated is placed in the storage unit 10. When the material to be evaporated is Al, the storage unit 10 may be made of a material inducing the wetting phenomenon, and the W material is used in the present Example. As described above, deposition efficiency is reduced due to wetting of Al when W is used. Accordingly, it is difficult to continuously perform deposition, and the crucible must be replaced with a new one. However, in the present Example, problems related to the wetting phenomenon are prevented due to the wetting prevention unit 20, and accordingly, W may be used.

The wetting prevention unit 20, which is combined with the exterior of the storage unit 10, is taller than the storage unit 10. Accordingly, the internal side of the wall of the wetting prevention unit 20 is exposed in a region thereof that is not combined with the storage unit 10. The internal side of the wall of the internal unit 22 of the wetting prevention unit 20 is partially exposed, and the internal unit 22 includes $Al_2O_3$, which is a ceramic material not facilitating the wetting phenomenon, when the material to be evaporated is Al.

Due to the internal unit 22, which includes the ceramic material not facilitating the wetting phenomenon of Al, of the aforementioned structure, the wetting phenomenon of Al is prevented from proceeding to the top portion of the crucible, and contact with the ceramic material, which reduces the purity of the deposited Al thin film, is minimized, thereby preventing the specific resistance of the Al thin film from increasing. Specifically, the internal side of the wall of the storage unit 10 is 7 mm high. The exposed portion of the wall of the internal unit 22, which is not combined with the storage unit 10 and is exposed above the storage unit 10, is 3 mm high. The height of the exposed portion of the wall of the internal unit 22 is not particularly limited, but Al may be prevented from creeping along the surface of the wall and wetting the wall when the height is about 2 mm or more.

In addition, the external unit 24 of the wetting prevention unit 20 may include a Cu material, which is a conductive metal. The storage unit 10, the internal unit 22, and the external unit 24 may be fastened together using the bolt 30, which includes the conductive material, to thus electrically connect the storage unit 10 and the external unit 24. The external unit 24 may be electrically connected to the electron-beam evaporator, and accordingly, the storage unit 10, which includes molten Al, and the electron-beam evaporator may be electrically connected to each other. The material of the bolt 30 may be appropriately selected depending on the situation, W being used in the present Example.

Figure 2:
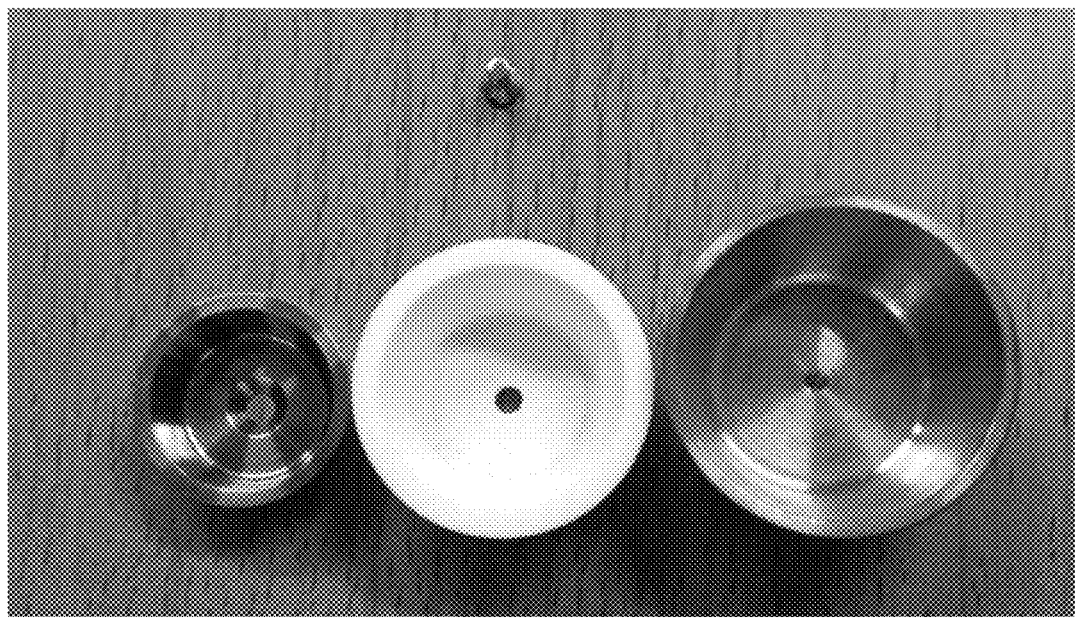
FIG. 2 is a picture showing constitutional parts of the crucible for the electron-beam evaporator according to the present Example.
Figure 3:
FIG. 3 is a picture showing the assembled constitutional parts of FIG. 2.

FIG. 2 is a picture showing the constitutional parts of the crucible for the electron-beam evaporator according to the present Example, and FIG. 3 is a picture showing the assembled constitutional parts.

Al was deposited using the crucible for the electron-beam evaporator shown in the drawings according to the present Example and crucibles of Comparative Examples, and a comparison was performed.

Figure 4:
FIG. 4 is a picture showing the crucible for the electron-beam evaporator according to the present Example, after being used for depositing Al.
Figure 5:
FIG. 5 is a picture showing a W crucible according to a Comparative Example, after being used for depositing Al.
Figure 6:
FIG. 6 is a picture showing a ceramic crucible according to a Comparative Example, after being used for depositing Al.

FIG. 4 is a picture showing the crucible for the electron-beam evaporator according to the present Example after Al is deposited using the same, FIG. 5 is a picture showing a W crucible according to the Comparative Example after Al is deposited using the same, and FIG. 6 is a picture showing an Al$_2$O$_3$ ceramic crucible according to the Comparative Example after Al is deposited using the same.

It is confirmed that only the storage unit, which is positioned at the innermost side and includes the W material, is wet with Al after the deposition process of Al in the crucible of the present Example of FIG. 4, and that the internal side of the internal unit, which includes the ceramic material, is exposed.

However, from FIG. 5, showing that the W material constitutes the entire crucible according to the Comparative Example, it can be seen that even the uppermost portion of the wall of the crucible is wet with Al. The Al wetting of the uppermost portion of the wall reduces the evaporation efficiency of Al, and accordingly, the crucible needs to be replaced in order to evaporate Al at the subsequent processing. On the other hand, the crucible of the present Example, which is shown in FIG. 4, is capable of being further used.

Meanwhile, from FIG. 6, showing the crucible that includes the ceramic material, it can be confirmed that the crucible is rarely wet with Al.

Figure 7:
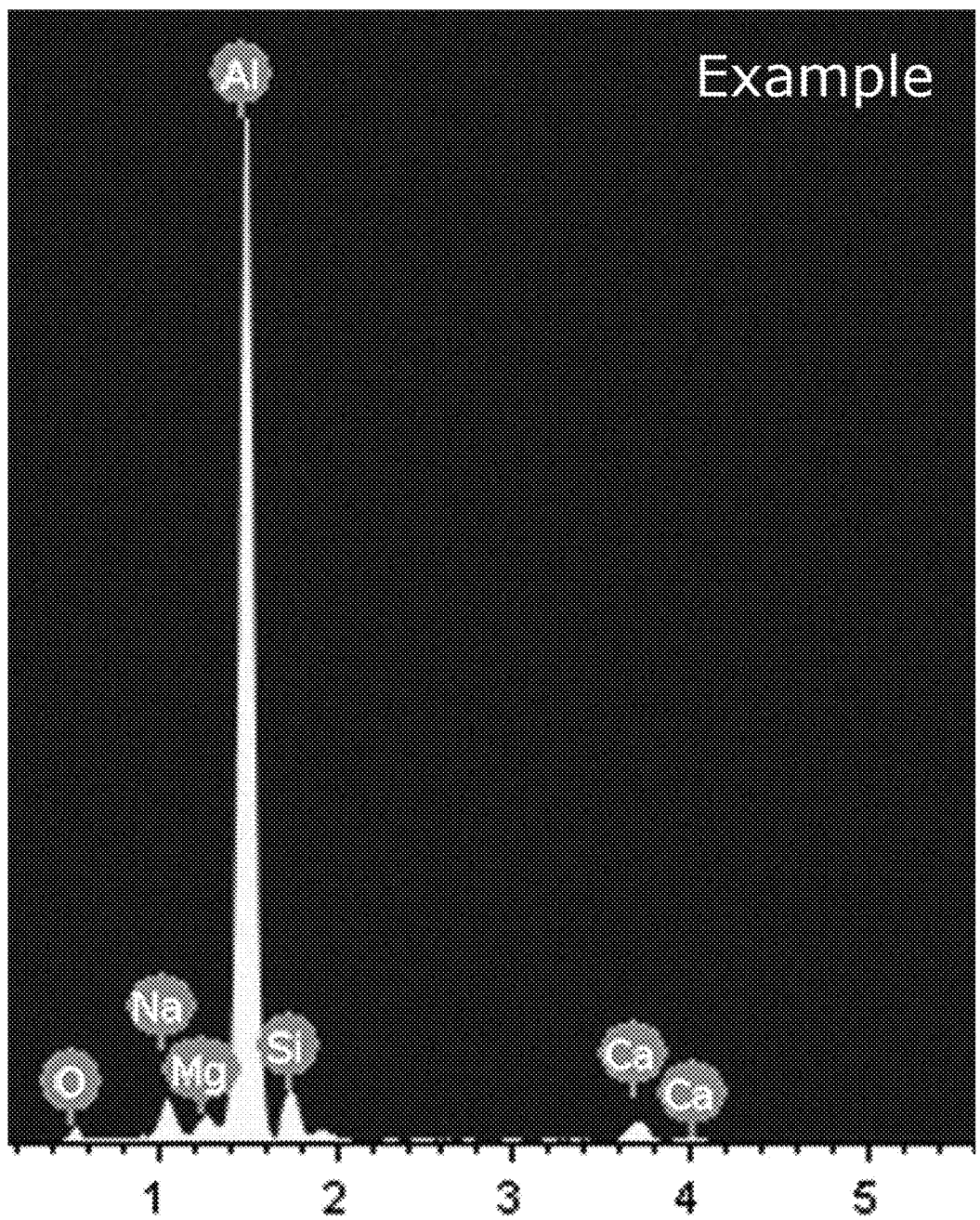
FIGS. 7 and 8 show the result of EDS analysis of components of an Al thin film, which is formed using electron-beam evaporation on the crucible according to the present Example and on the ceramic crucible.
Figure 8:
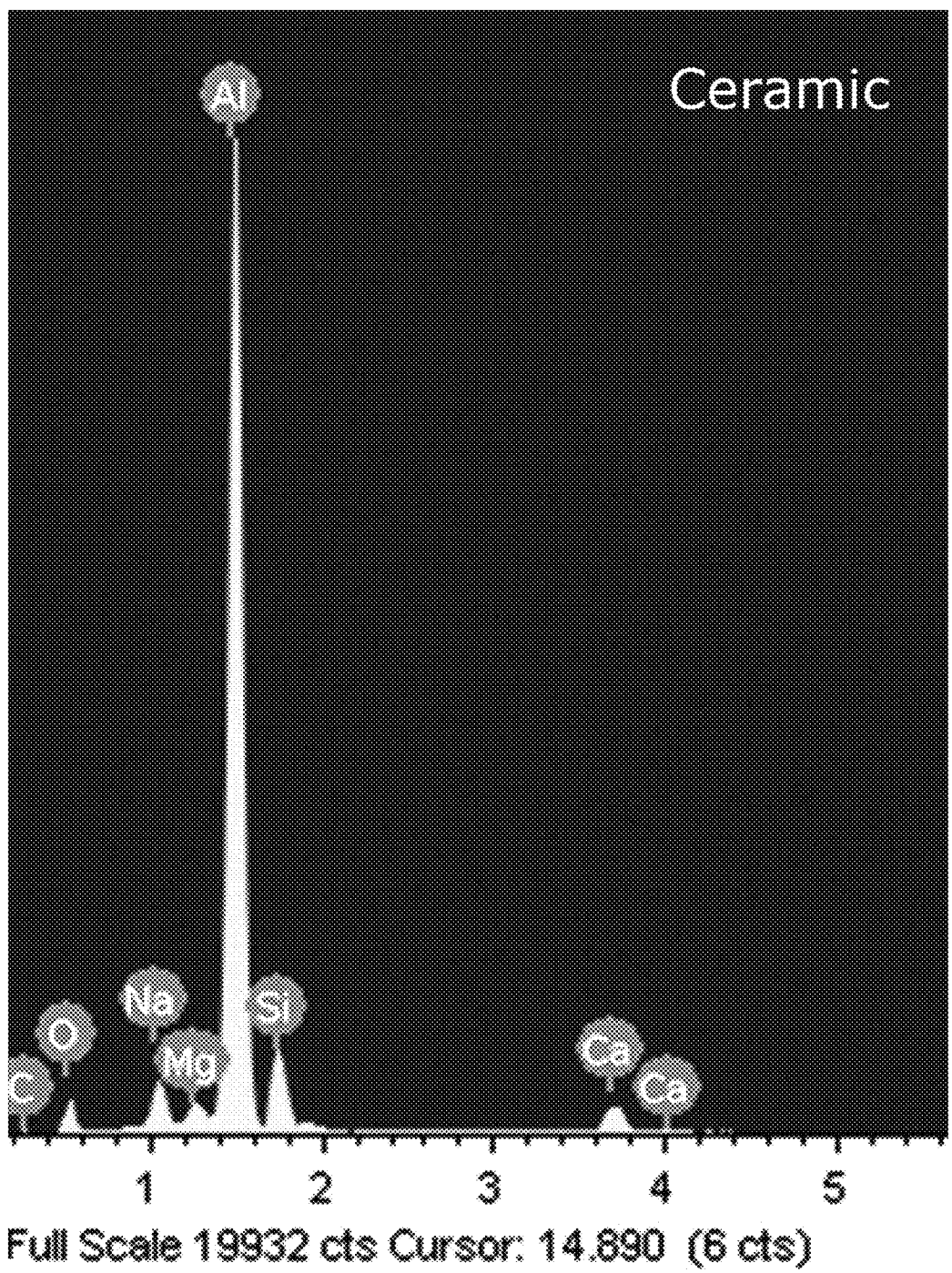

FIGS. 7 and 8 show the result of EDS analysis of components of an Al thin film, which is deposited by electron-beam evaporation using the crucible according to the present Example and the ceramic crucible according to the Comparative Example.

The components of the Al thin film shown in FIGS. 7 and 8 are described in Table 1.

TABLE 1

| Crucible | C | O | Al | Na | Mg | Si | Ca |
|---|---|---|---|---|---|---|---|
| Example | — | 12.5 | 71.3 | 3.8 | 1.12 | 9.0 | 2.3 |
| Ceramic | 7.8 | 21.4 | 54.2 | 3.9 | 1.3 | 9.5 | 2.0 |

As seen from the drawings and the table, when the crucible including the ceramic material according to the Comparative Example is used, the content of oxygen is high and carbon is detected, but carbon is not detected when the crucible of the present Example is used. Based on the aforementioned description, the reason why the specific resistance of the Al thin film deposited by electron-beam evaporation using the ceramic crucible is relatively high can be understood.

Figure 9:
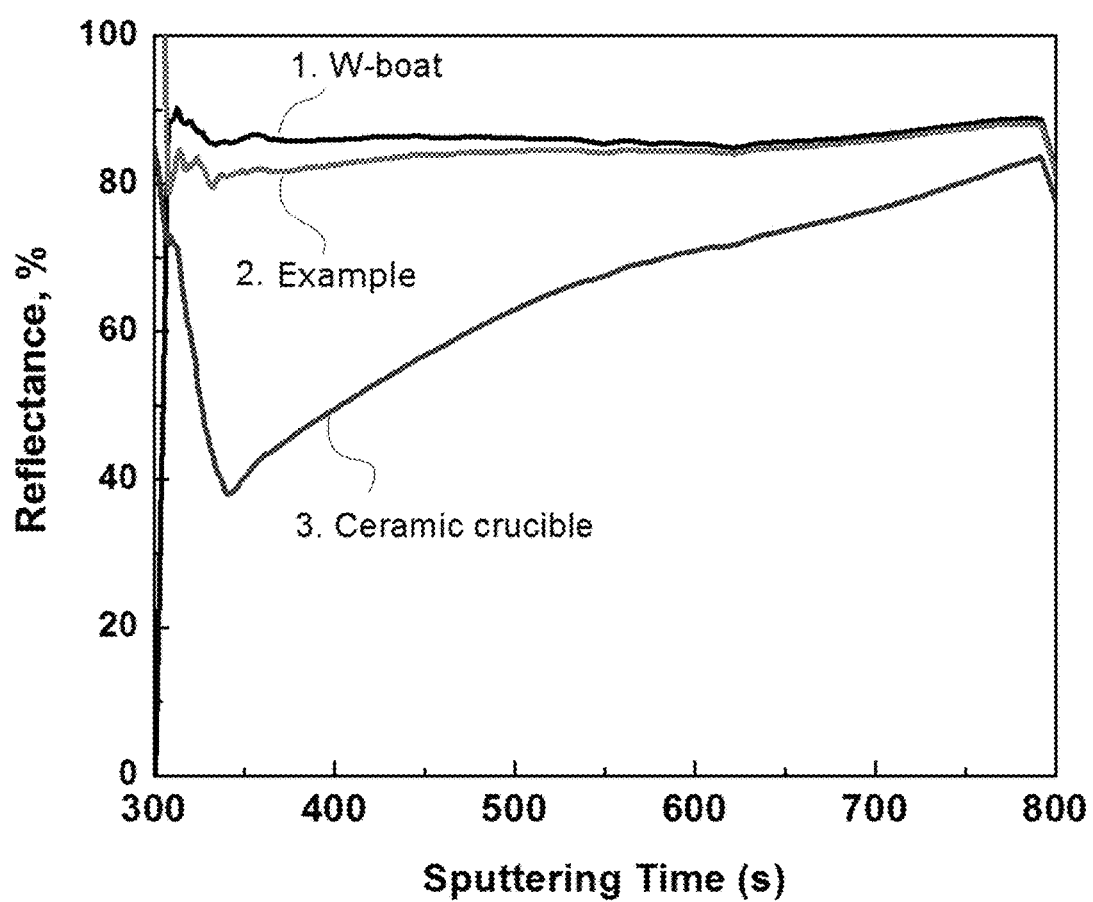
FIG. 9 shows the result of measurement of reflectance of the Al thin film, which is formed using the electron-beam evaporation process on the crucibles according to the present Example and the Comparative Example.

FIG. 9 shows the result of measurement of reflectance of the Al thin film, which is formed by the electron-beam evaporation process using the crucibles according to the present Example and the Comparative Example.

The Al thin film, which is deposited using the ceramic crucible of the Comparative Example, absorbs light having low wavelengths to thus exhibit a relatively light red color. However, the Al thin film, which is deposited using the crucible of the present Example, is almost the same as that of the W crucible of the Comparative Example. Accordingly, it can be confirmed that there is little influence attributable to the internal unit including the ceramic material.

An electron-beam evaporator according to another embodiment of the present invention includes the crucible having the aforementioned structure, and all types of technologies regarding the electron-beam evaporator may be applied to constitutional parts other than the crucible, if they do not conflict with the feature of the present invention, and accordingly, a detailed description thereof will be omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A crucible for an electron-beam evaporator, which is used in an evaporation source of the electron-beam evaporator, the crucible comprising:
   a storage unit which includes a wall and a bottom and in which a deposition material is placed;
   a wetting prevention unit which is combined with an exterior of the storage unit; and
   a bolt including an electrical conductive material,
   wherein the wetting prevention unit includes two combined parts having an internal unit and an external unit, the internal unit includes a ceramic material, and the external unit includes an electrical conductive metal material,
   wherein the external unit is electrically connected to the storage unit,
   wherein the internal unit includes a wall combined with the wall of the storage unit and a bottom combined with the bottom of the storage unit, and the external unit includes a wall combined with the wall of the internal unit and a bottom combined with the bottom of the internal unit,
   wherein the bottom of the storage unit includes an upper surface and a lower surface,
   wherein the bottom of the internal unit includes an upper surface and a lower surface,
   wherein the bottom of the external unit includes an upper surface and a lower surface,
   wherein the lower surface of the bottom of the storage unit is entirely covered by the upper surface of the internal unit,
   wherein the lower surface of the bottom of the internal unit is entirely covered by the upper surface of the external unit,
   wherein a first through hole is formed through the bottom of the storage unit, a second through hole is formed through the bottom of the internal unit, and a groove is formed in the bottom of the external unit,
   wherein the bolt is screwed through the first through hole and the second through hole into the groove formed in the bottom of the external unit such that the external unit is electrically connected to the storage unit via the bolt, and
   wherein an internal side of the wall of the internal unit surrounds an external side of the wall of the storage unit and is partially exposed above the wall of the storage unit, and an internal side of the wall of the external unit surrounds an external side of the wall of the internal unit, and each of the wall of the internal unit and the wall of the external unit is taller than the wall of the storage unit.

2. The crucible of claim 1, wherein the storage unit includes a material that induces a wetting phenomenon of Al, and the wetting prevention unit includes a material that does not induce the wetting phenomenon of Al.

3. The crucible of claim 2, wherein the storage unit includes any one selected from W, Mo, Ta, and TiB$_2$, BN, and TiB$_2$.BN materials.

4. The crucible of claim 3, wherein the wetting prevention unit includes a ceramic material.

5. The crucible of claim 1, wherein the external unit includes a Cu material.

6. The crucible of claim 1, wherein the bolt includes a Mo or W material.

7. The crucible of claim 1, wherein the internal side of the wall of the internal unit is partially exposed due to a difference in height of the wall of the storage unit and the wall of the internal unit so that an exposed portion of the internal unit has a height of 2 mm or more.

8. An electron-beam evaporator for radiating accelerated electrons to evaporate a material and then deposit the material, the electron-beam evaporator comprising:
    the crucible of claim 1 as an evaporation source containing the material.

\* \* \* \* \*